United States Patent
Zhu

(10) Patent No.: US 6,879,158 B2
(45) Date of Patent: Apr. 12, 2005

(54) METHOD FOR ACCELERATING FOCUSED EXCITATION WITH MULTIPLE RF TRANSMIT COILS

(75) Inventor: Yudong Zhu, Clifton Park, NY (US)

(73) Assignee: General Electric Company, Niskayuna, NY (US)

(*) Notice: Subject to any disclaimer, the term of this patent is extended or adjusted under 35 U.S.C. 154(b) by 42 days.

(21) Appl. No.: 10/063,845

(22) Filed: May 17, 2002

(65) Prior Publication Data

US 2003/0214294 A1 Nov. 20, 2003

(51) Int. Cl.[7] ................................................. G01V 3/00
(52) U.S. Cl. ...................................... 324/318; 324/309
(58) Field of Search ............................... 324/318, 322, 324/309, 307, 320; 128/653.5

(56) References Cited

U.S. PATENT DOCUMENTS

| | | | | |
|---|---|---|---|---|
| 4,985,677 A | | 1/1991 | Pauly ......................... | 324/309 |
| 5,543,711 A | * | 8/1996 | Srinivasan et al. ......... | 324/318 |
| 6,040,697 A | * | 3/2000 | Misic ......................... | 234/318 |
| 6,404,199 B1 | * | 6/2002 | Fujita et al. ................ | 324/318 |
| 6,411,090 B1 | * | 6/2002 | Boskamp .................... | 324/318 |
| 6,441,615 B1 | * | 8/2002 | Fujita et al. ................ | 324/318 |

* cited by examiner

Primary Examiner—Brij B. Shrivastav
(74) Attorney, Agent, or Firm—Jean K. Testa; Patrick K. Patnode

(57) ABSTRACT

A transmit coil array assembly for use in a magnetic resonance imaging (MRI) system comprises a plurality of radio frequency (RF) coils arranged in a configuration for transmitting in parallel during transmission mode of the MRI system and a plurality of corresponding RF amplifiers each coupled to a corresponding RF coil for driving currents in the RF coils. The currents are controlled for defining and steering an excitation volume within an examined subject. The currents along with the currents in the gradient coils are further controlled to effect accelerated multi-dimensional excitation. A method for magnetic resonance imaging (MRI) with multiple transmit coils comprises the step of exciting a portion of an examined subject with the multiple transmit coils and the step of receiving magnetic resonance (MR) signals from at least one radio frequency (RF) coil for generating images corresponding to the selected portion of the subject.

10 Claims, 5 Drawing Sheets

5B

5C

5D

5A Localization Profiles/Coil

METHOD FOR ACCELERATING FOCUSED EXCITATION WITH MULTIPLE RF TRANSMIT COILS

BACKGROUND OF INVENTION

This invention relates generally to magnetic resonance imaging (MRI), and more particularly, to transmit coil arrays used in MRI.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the magnetic resonance (MR) signal emitted by a given precessing nucleus depends on the strength of the magnetic field at the nucleus' location. As is well known in the art, it is possible to distinguish radiation originating from different locations within the person's body by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

Parallel imaging methods represented by SENSE (SENSitivity encoding and SMASH (simultaneous acquisition of spatial harmonics) use multiple receive coils to accelerate acquisition they accommodate acquisition k-space sampling density reduction by integrating spatial information encoded with the coils' sensitivity profiles.

Under circumstances where anatomy of interest is contained in a local region, focused excitations that target the region through, for example, local small coil transmit or multi-dimensional excitation may also allow sampling density reduction. However, the small coil method is less effective targeting a distant region or defining specific excitation volumes, and the multi-dimensional excitation method often involves prolonged excitation periods reduction of which demands more capable gradients.

What is needed is a method for accelerating focused excitations, for example an excitation counterpart to SENSE-based parallel acquisition.

SUMMARY OF INVENTION

In a first aspect, a transmit coil array assembly for use in a magnetic resonance imaging (MRI) system is provided. The assembly comprises a plurality of coils arranged in a configuration for transmitting in parallel during the transmission mode of the MRI system and a plurality of corresponding RF amplifiers each coupled to a corresponding coil for driving currents in the coils. The currents are controlled for defining and steering an excitation volume within an examined subject. The currents along with the currents in the gradient coils of the MRI system are further controlled to effect accelerated multi-dimensional excitation.

In a second aspect, a method for magnetic resonance imaging (MRI) with multiple transmit coils is provided. The method comprises the step of exciting a portion of an examined subject with the multiple transmit coils and the step of receiving magnetic resonance (MR) signals from at least one radio frequency (RF) coil for generating images corresponding to the selected portion of the subject.

BRIEF DESCRIPTION OF DRAWINGS

The features and advantages of the present invention will become apparent from the following detailed description of the invention when read with the accompanying drawings in which.

DETAILED DESCRIPTION

Figure 1:
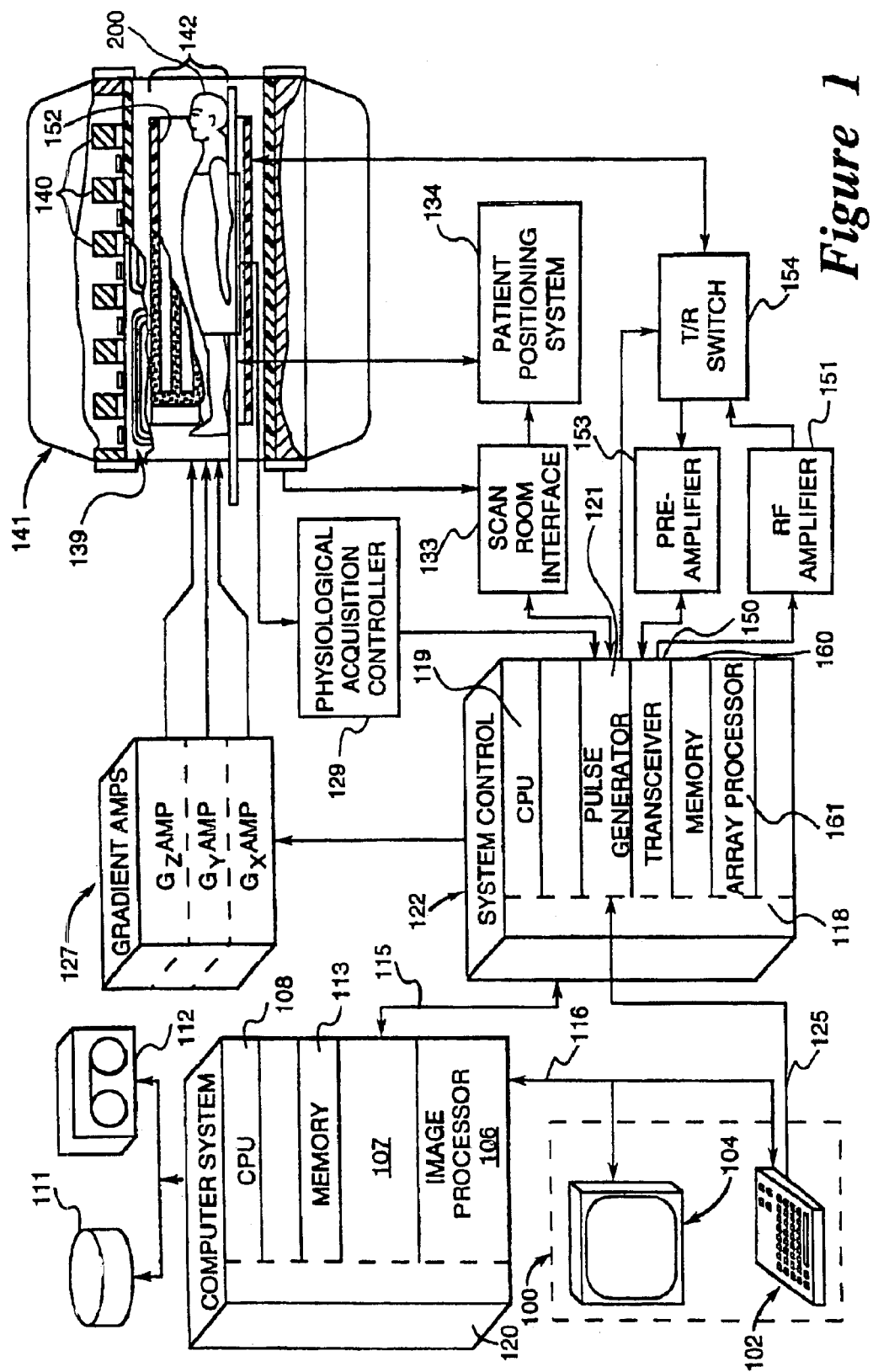
FIG. 1 illustrates a simplified block diagram of a Magnetic Resonance Imaging system to which embodiments of the present invention are useful.

FIG. 1 illustrates a simplified block diagram of a system for producing images in accordance with embodiments of the present invention. In an embodiment, the system is an MR imaging system that incorporates embodiments of the present invention. The MR system could be, for example, a GE-Signa MR scanner available from GE Medical Systems, Inc., which is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a RF coil system 152. Volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging. A transceiver module 150 in the system control 122 produces pulses that are amplified by a RF amplifier system 151 and coupled to the RF coil system 152 by a transmit/receive switch system 154. The resulting signals radiated by the excited nuclei in the subject 200 may be sensed by the same RF coil system 152 and coupled through the transmit/receive switch system 154 to a preamplifier system 153. The amplified MR signals are demodulated, filtered, and digitized in the receiver section of the transceiver 150. The transmit/receive switch 154 is controlled by a signal from the pulse generator module 121 to electrically connect the RF amplifier system 151 to the coil system 152 during the transmit mode (i.e., during excitation) and to connect the preamplifier system 153 during the receive mode. The transmit/receive switch system 154 also enables a separate RF coil (not shown, for example, a head coil or surface coil) to be used in either the transmit or receive mode. In embodiments of the present invention, the RF coil system 152 is a transmit coil array assembly that will be described with reference to FIGS. 2–5. During the transmit mode, the RF pulse waveforms produced by the pulse generator module 121 are applied to a RF amplifier system 151 comprised of multiple amplifiers. Each amplifier controls the current in a corresponding component coil of the coil system 152 in accordance with the amplifier's input RF pulse waveform. With the transmit/receive switch system 154, the RF coil system 152 is configured to perform transmission only, or alternatively, configured to additionally act as a receive coil array during receive mode. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC) that is programmed to perform a sequel to provide an output in response to given input signals.

The MR signals picked up by the RF coil system 152 or a separate receive coil (not shown, for example, a body, head or surface coil) are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104. Further processing is performed by the image processor 106 that includes reconstructing acquired MR image data. It is to be appreciated that a MRI scanner is designed to accomplish field homogeneity with given scanner requirements of openness, speed and cost.

Figure 3:
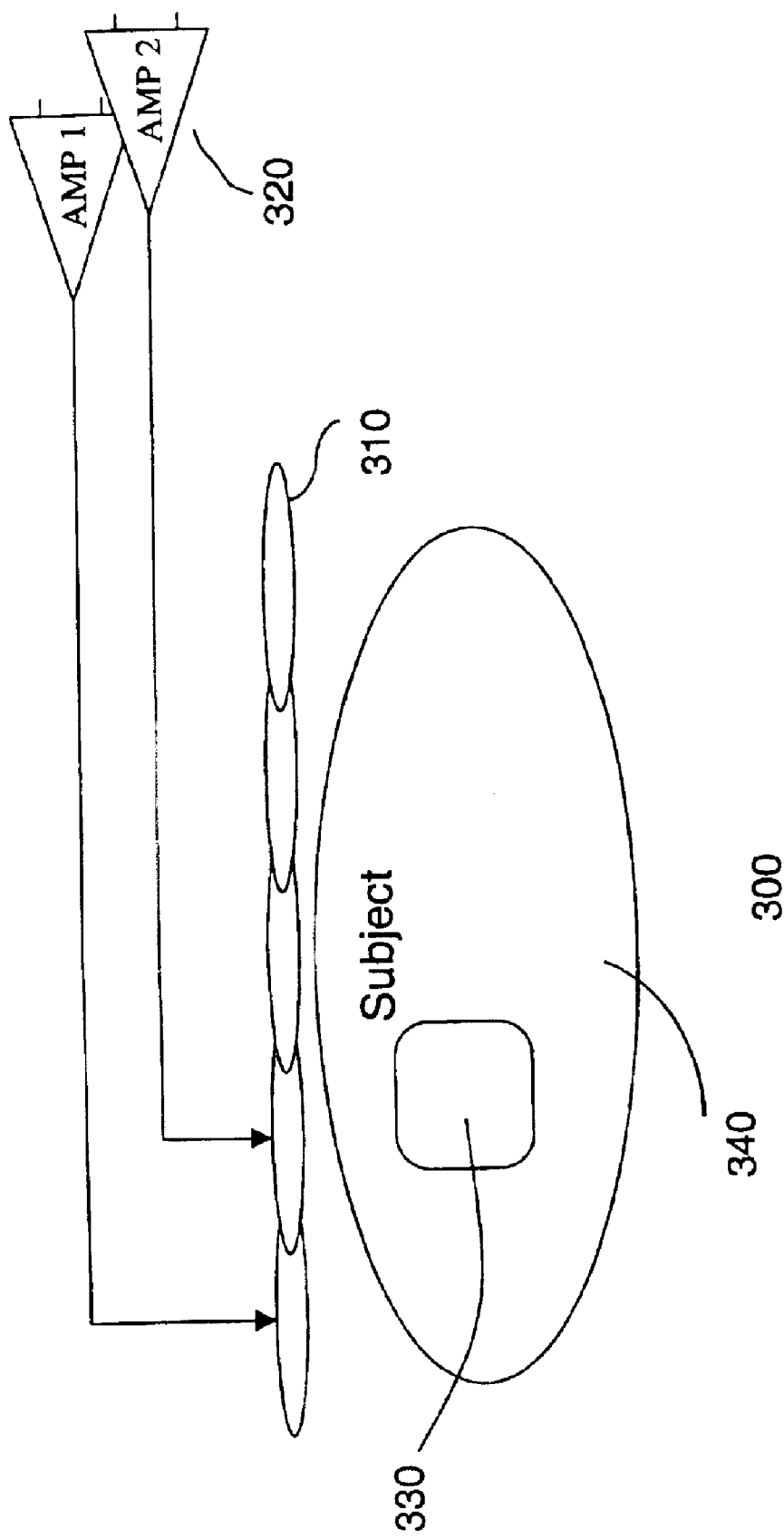
FIG. 3 is a simplified block diagram showing of a linear transmit coil array assembly in accordance with one embodiment of the present invention.

Referring to FIG. 3, in a first embodiment, a transmit coil array assembly 300 for use in a magnetic resonance imaging (MRI) system comprises a plurality of radio frequency (RF) coils 310 configured for transmitting in parallel during transmission mode and a plurality of RF amplifiers 320 coupled to the corresponding RF coils adapted to generate a controlled current in each of the RF coils and wherein the controlled current being for defining and steering an excitation volume 330 of an subject 340 within the MRI system. In FIG. 3, the placement of the coils is substantially linear.

Figure 4:
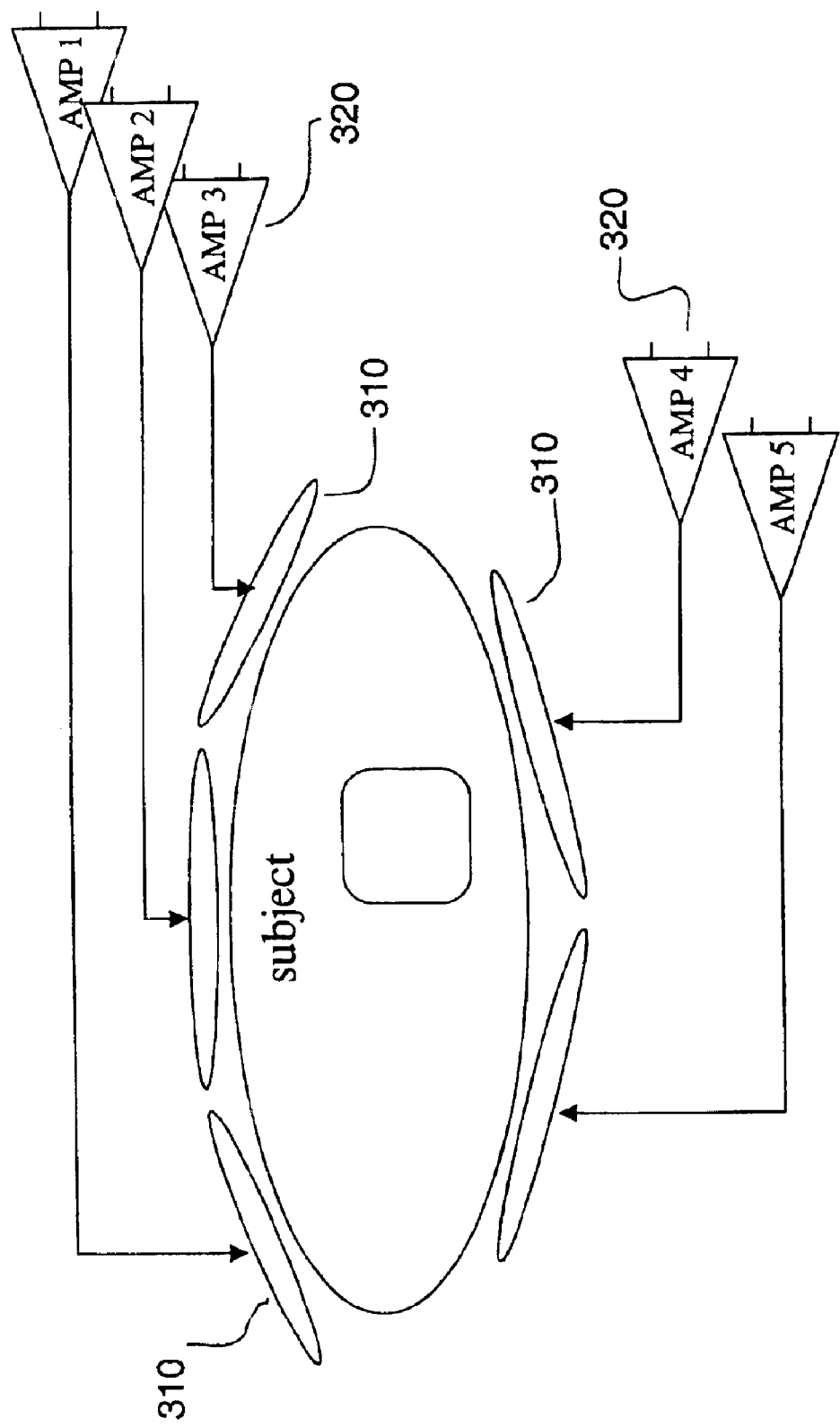
FIG. 4 is a simplified block diagram showing of a transmit coil array assembly in accordance with another embodiment of the present invention; and, FIGS. 5A–D are graphical illustrations corresponding to the embodiment of transmit coil array shown in FIG. 2 embodiment of the present invention.

Referring to FIG. 4, an alternative embodiment is shown in which RF coils 310 are arranged in an equally distributed pattern about the object, such as a circle.

The transverse magnetization resulting from a small-tip excitation due to a single transmit coil may be analyzed by the Fourier transform of the k-space trajectory traversed and weighted during the excitation:

$$M(x) = b(x) \int_k W(k)S(k)e^{j2\pi x \cdot k} dk \tag{1}$$

where b(x) describes the spatial variation of the transmit coil's $B_1$ field, W(k), a spatial frequency weighting controlled by the time-varying current driving the coil, and S(k), a spatial frequency sampling trajectory controlled by the time-varying gradient field (W(k) and S(k) are described in greater detail in U.S. Pat. No. 4,985,677 to Pauly which relates them to the currents in the RF transmit coil and gradient coils).

In a further case of parallel excitation with a transmit coil array that are independently driven by associated RF amplifiers, linearity leads to:

$$M(x) = \sum_n b_n(x) \int_k W_n(k) S(k) e^{j2\pi x \cdot k} dk \qquad (2)$$

where n is the coil index. To achieve an example 2D focused excitation with localization along both x and y as specified by M(x)=f(x)·g(y), we consider the use of an echo planar trajectory with $\Delta_{k_x}$ separation between adjacent lines, multiple transmit coils lined up uniformly along x and $W_n(k)$'s of form $W_n(k)=u_n(k_x)v(k_y)$, Eqn.2 then becomes:

$$f(x) = \sum_n b(x - n\Delta_x) \left( \sum_m u_n(m\Delta_{k_x}) e^{j2\pi x m \Delta_{k_x}} \right) \qquad (3)$$

$$g(y) = \int_{k_y} v(k_y) e^{j2\pi y k_y} dk_y$$

For simplicity, $b_n(x)$'s are assumed to have negligible y- or z-direction variation in the targeted volume and may be described by $b(x-n\Delta_x)$'s.

In a body coil transmit case (i.e., single coil with b(x)≈1), it is well understood that an appropriate design for $u(m\Delta_{k_x})$ is the Fourier transform of f(x) and that $\Delta_{k_x}$ must be small enough to prevent aliasing side lobes from locating inside the examined subject, which is detailed in U.S. Pat. No. 4,985,677 to Pauly. With multiple coils transmitting in parallel, it is conceivable that one may accomplish a comparable localization at a reduced excitation k-space sampling density while an increased $\Delta_{k_x}$ causes aliasing lobes to locate inside the subject, incoherent addition achieved with an appropriate design of the $u_n(m\Delta_{k_x})$'s may reduce/annihilate their net amplitudes. Specifically, it is to be noted that f(x) is a spatially-weighted sum of several periodic functions (period=1/$\Delta_{k_x}$). The task of eliminating aliasing side lobes parallels the de-aliasing of a Cartesian-trajectory SENSE reconstruction which may be shown to be in effect calculating a spatially-weighted sum of periodic functions (images).

To design the $u_n(m\Delta_{k_x})$'s given the f and the b's, we note that if one computes, based on b, $\Delta_x$ and $\Delta_{k_x}$, a function β that is the dual frame of b, then $u_n(m\Delta_{k_x})$'s evaluated as in the following will satisfy Eqn.3:

$$u_n(m\Delta_{k_x}) = \int_x f(x) \beta^*(x - n\Delta_x) e^{-j2\pi x m \Delta_{k_x}} dx \qquad (4)$$

To avoid alising lobes while creating desired main lobe Eqn.4 suggests the k-space weighting contributed by the $n^{th}$ coil be the Fourier transform of a spatially weighted version of f. A robust numerical algorithm for computing β has been developed, for the situation where $\Delta_{k_x} < 1/\Delta_x$. The robustness of aliasing lobe elimination against perturbation is fundamentally determined by b, $\Delta_x$ and $\Delta_{k_x}$, in much the same way as is the robustness or SNR-characteristic of a SENSE acquisition with a corresponding setup.

Figure 2:
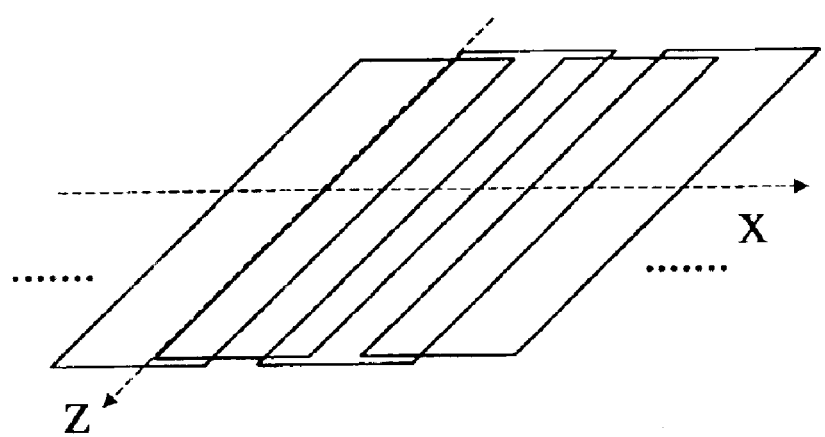
FIG. 2 is a simplified block diagram showing of a transmit coil array to which embodiments of the present invention are applicable.

Referring to FIG. 2, there is shown an embodiment of a transmit coil 200 in which ten coils 210 are aligned in a linear fashion along the x-axis. While a conventional 2D selective excitation pulse may produce localization along two spatial dimensions and thus expedite subsequent spatial encoding, the excitation often involves time-consuming 2D k-space traversing. In this embodiment, multiple transmit coils 210 exciting in parallel speedup 2D excitation as excitation k-space sampling density is lowered yet aliasing side lobes in examined subjects are minimized. This is achieved by exploiting the spatial and spatial-frequency weighting associated with the transmit coils in a way described above.

An example small-tip-angle excitation using these ten coils transmitting in parallel was simulated. The coils in this example were 19.8 cm×6.4 cm rectangular loop coils and were lined up along x with a uniform center-to-center spacing of 4 cm (FIG. 2). Driven by the gradient field, an echo planar trajectory sampled the excitation $k_x$–$k_y$ plane with $k_x$ being the slow traverse direction.

Figure 5:
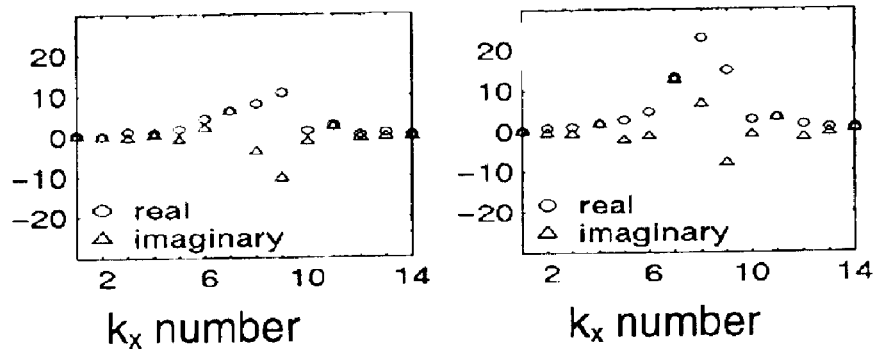
Figure 5:
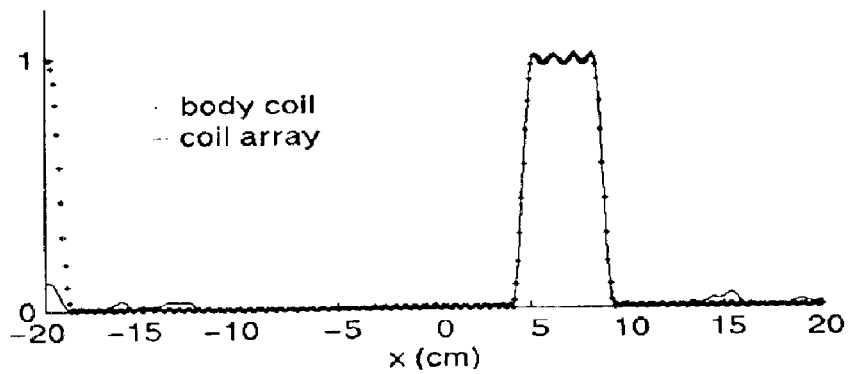
Figure 5:
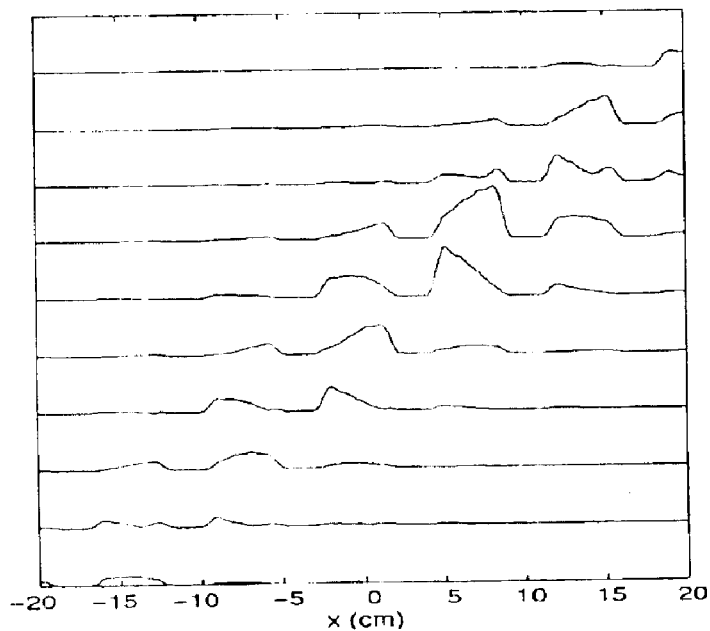

Referring to FIG. 5, a 2D excitation targeting a 5 cm by 5 cm region centered at x=6.6 cm and y=3.0 cm inside a 30 cm-wide subject was studied as an example. As a reference, the task was first approached with a body transmit coil and known excitation methods. One design used 57 $k_x$=constant lines at $\Delta_{k_x}$=1/28 cycles/cm resulting in an x-direction localization as shown in FIG. 5D. Its acceleration was then tackled with the transmit coil array and the present methods described herein. One design that represents a 4-fold acceleration employed 14 $k_x$=constant lines at $\Delta_{k_x}$=1/7 cycles/cm. $u_3(m\Delta_{k_x})$ and $u_5(m\Delta_{k_x})$, the $k_x$-direction weighting contributed by the coils positioned at x=12 cm and x=4 cm respectively, as computed with Equation 4, are illustrated in FIGS. 5B–C. Localization along x due to each of the 10 coils is shown in FIG. 5A (amplitudes). Note that while the first aliasing side lobes were 4 times closer to the target due to the sampling density reduction, the net amplitudes of these as well as other aliasing lobes that located inside the subject were negligible as a result of incoherent addition. Localization from the parallel excitation matched well that of the body coil (FIG. 5D), and was as well refocused (the imaginary component, not shown, was very small). As used herein, "parallel excitation" refers to simultaneous excitation by multiple coils. Lack of coils contributing from beyond the present array's boundary caused residual aliasing lobes (incomplete annihilation) near the array's ends. For a wider subject that is subject to this boundary effect, a remedy is to extend the array or adjust boundary coils' weighting.

Further provided is a method for magnetic resonance imaging (MRI) with multiple transmit coils. The method comprises the steps of exciting a portion of an examined subject with the multiple transmit coils. The coils are configured for parallel excitation and the currents are controlled to achieve fast excitation of a selected portion of the subject. Particularly, the currents are each controlled by a RF pulse waveform designed along with the gradient waveforms to effect accelerated excitation k-space traversing by the means of reducing excitation k-space sampling density. The further method may comprise the step of receiving magnetic resonance (MR) signals from at least one radio frequency (RF) coil for generating images corresponding to the selected portion of the object. A body coil, a surface coil or a phased array may be used to receive the signal. Alternatively, the multiple coils performing parallel transmission during the transmission mode may be configured to additionally perform signal reception during receiving mode. Further, with multiple-coil receiving, parallel acquisition techniques such as SENSE may be applied.

Compared to a body coil method, the present coil-array method may produce comparable localization at a fraction of time by sampling the same portion of excitation k-space but at a lowered density. Compared to a local small coil method, the definition/steering of the excitation volume is flexibly controlled with currents. The method does not constrain acquisition k-space trajectory or complicate image reconstruction, and may be used in conjunction with parallel acquisitions.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A radio frequency (RF) coil array assembly for use in a magnetic resonance imaging (MRI) system comprising:
    a plurality of coils arranged in a configuration for transmitting in parallel during the transmission mode of the MRI system; and,
    a plurality of corresponding RF amplifiers each coupled to a corresponding coil and generating controlled currents in the coils, the currents each being controlled by an RF pulse waveform designed along with gradient waveforms, the waveforms being designed to effect shorter time-span excitation k-space traversing by means of reducing excitation k-space sampling density and wherein the controlled currents define and steer an excitation volume of an examined subject within the MRI system.

2. The RF coil array assembly of claim 1 wherein the RF coils are arranged in a linear pattern.

3. The RF coil array assembly of claim 1 wherein the RF coils are arranged in a substantially even distribution about the object.

4. The RF coil array assembly of claim 3 wherein the RF coils are further arranged in a substantially circular pattern about the object.

5. The RF coil array assembly of claim 1 wherein the RF pulse wave forms are computed based on a desired shape and location of an excitation volume as well as RF field profiles of the RF coils.

6. A method for magnetic resonance imaging (MRI) with multiple transmit coils, the method comprising:
    exciting a portion of an examined subject with the multiple transmit coils configured for parallel excitation;
    controlling respective currents in the multiple transmit coils to define and steer an excitation volume of a selected portion of the subject, wherein the respective currents are each controlled by an RF pulse waveform designed to effect shorter time-span excitation k-space traversing by means of reducing excitation k-space sampling; and,
    receiving magnetic resonance MR signals from at least one RF coil adapted to receive signals to generate an image corresponding to the selected portion of the object.

7. The method of claim 6 where the at least one radio frequency (RF) coil adapted to receive signals is a separate from than the multiple transmit coils.

8. The method of claim 7 wherein the at least one RF coil comprises a body coil or a surface coil.

9. The method of claim 7 wherein the at least one RF coil comprises a MRI phased-array.

10. The method of claim 6 wherein the multiple transmit coils are used during a transmission mode and is further used as the at least one RF coil to receive signal during a receive mode.

* * * * *

UNITED STATES PATENT AND TRADEMARK OFFICE
CERTIFICATE OF CORRECTION

PATENT NO. : 6,879,158 B2
DATED : April 12, 2005
INVENTOR(S) : Yudong Zhu

It is certified that error appears in the above-identified patent and that said Letters Patent is hereby corrected as shown below:

<u>Column 7,</u>
Lines 18-34, Claim 1 should read as follows:
1. A radio frequency (RF) coil array assembly for use in a magnetic resonance imaging (MRI) system comprising:

a plurality of RF coils arranged in a configuration for transmitting in parallel during the transmission mode of the MRI system; and, a plurality of corresponding RF amplifiers each coupled to a corresponding coil and generating controlled currents in the coils, the currents each being controlled by an RF pulse waveform designed along with gradient waveforms, the waveforms being designed to effect shorter time-span excitation k-space traversing by means of reducing excitation k-space sampling density and wherein the controlled currents define and steer an excitation volume of an examined subject within the MRI system.

Signed and Sealed this

Thirteenth Day of December, 2005

JON W. DUDAS
*Director of the United States Patent and Trademark Office*